US008566010B2

(12) United States Patent
Sarma et al.

(10) Patent No.: US 8,566,010 B2
(45) Date of Patent: Oct. 22, 2013

(54) SYSTEM AND METHOD FOR PROVIDING ROAD CONDITION AND CONGESTION MONITORING USING SMART MESSAGES

(75) Inventors: Sanjay E. Sarma, Lexington, MA (US); Stephen Sai-Wung Ho, Cambridge, MA (US); Joshua E. Siegel, Bloomfield Hills, MI (US)

(73) Assignee: Massachusetts Institute of Technology, Cambridge, MA (US)

( * ) Notice: Subject to any disclaimer, the term of this patent is extended or adjusted under 35 U.S.C. 154(b) by 156 days.

(21) Appl. No.: 12/821,176

(22) Filed: Jun. 23, 2010

(65) Prior Publication Data

US 2011/0320111 A1 Dec. 29, 2011

(51) Int. Cl.
*G01R 27/28* (2006.01)
*G01C 21/26* (2006.01)

(52) U.S. Cl.
USPC .......... 701/118; 701/200

(58) Field of Classification Search
USPC .......... 701/118
See application file for complete search history.

(56) References Cited

U.S. PATENT DOCUMENTS

| | | | | |
|---|---|---|---|---|
| 5,173,691 | A | 12/1992 | Sumner | |
| 6,505,106 | B1 | 1/2003 | Lawrence | |
| 6,535,112 | B1 | 3/2003 | Rothschink | |
| 6,732,031 | B1 | 5/2004 | Lightner | |
| 6,810,321 | B1 * | 10/2004 | Cook | 701/117 |
| 6,925,378 | B2 * | 8/2005 | Tzamaloukas | 701/428 |
| 6,988,033 | B1 | 1/2006 | Lowrey | |
| 7,353,107 | B2 | 4/2008 | Breitenberger et al. | |
| 7,454,288 | B2 | 11/2008 | Parikh et al. | |
| 7,532,962 | B1 | 5/2009 | Lowrey | |
| 2002/0150050 | A1 * | 10/2002 | Nathanson | 370/241 |
| 2003/0187571 | A1 | 10/2003 | Impson et al. | |
| 2004/0143378 | A1 | 7/2004 | Vogelsang | |
| 2005/0096049 | A1 | 5/2005 | Burch et al. | |
| 2006/0102397 | A1 | 5/2006 | Buck et al. | |
| 2006/0106530 | A1 | 5/2006 | Horvitz et al. | |
| 2006/0122749 | A1 | 6/2006 | Phelan | |
| 2006/0287808 | A1 | 12/2006 | Breitenberger et al. | |
| 2007/0010934 | A1 | 1/2007 | Breitenberger et al. | |

(Continued)

OTHER PUBLICATIONS

"Traffic Information Potential and Necessary Penetration Rates", Susanne Breitenberger et al., Extended Floating Car Data, Dec. 2004, pp. 390-395.

(Continued)

*Primary Examiner* — Hiep V Nguyen
(74) *Attorney, Agent, or Firm* — Peter A. Nieves; Sheehan Phinney Bass + Green PA

(57) ABSTRACT

A communication device for providing road conditions and monitoring congestion, contains a memory and a processor configured by the memory to perform the steps of: extracting key current vehicle and/or traffic insight; determining if the extracted key current vehicle and/or traffic insight represents a departure from expected vehicle and/or traffic insight; if the extracted key current vehicle and/or traffic insight is a departure from expected vehicle and/or traffic insight, using the key current vehicle and/or traffic insight to create a smart message, wherein the smart message contains the extracted key current vehicle and/or traffic insight; and if the extracted key current vehicle and/or traffic insight is a confirmation of expected vehicle and/or traffic insight, creating a confirmation message that does not contain the extracted key current vehicle and/or traffic insight, yet confirms similarity between the extracted key current vehicle and/or traffic insight and the expected vehicle and/or traffic insight.

14 Claims, 6 Drawing Sheets

(56) References Cited

U.S. PATENT DOCUMENTS

| | | | |
|---|---|---|---|
| 2007/0112503 A1 | 5/2007 | Johnson et al. |
| 2007/0256481 A1 | 11/2007 | Nishiyama et al. |
| 2008/0059051 A1 | 3/2008 | Kumagai et al. |
| 2008/0147307 A1 | 6/2008 | Liu et al. |
| 2008/0262670 A1 | 10/2008 | McClellan |
| 2008/0306687 A1 | 12/2008 | Ryu |
| 2009/0105942 A1 | 4/2009 | Lin et al. |
| 2009/0153364 A1 | 6/2009 | Buchalo et al. |
| 2010/0076675 A1 | 3/2010 | Barth et al. |
| 2010/0121522 A1 | 5/2010 | Wolfson et al. |

OTHER PUBLICATIONS

Mortazavi, Travel Times on Changeable Message Signs vol. III, Travel Time, California Center for Innovative Transportation Institute of Transportation Studies University of California Berkeley, Sep. 2009, p. V, para (004).

Mitretek Systems Inc., Surface Transportation Weather Decision Support Requirements, Report online, Jan. 24, 2009, pp. 67, 88-89.

Work, Daniel B. et al; A Distributed Highway Velocity Model for Traffic State Reconstruction, In review, Applied Mathematics and Optimization, Jun. 2009 pp. 1-23.

Herrera, Juan C. et al; Evaluation of Traffic Data Obtained Via GPS-enabled Mobile Phones: the Mobile Century Experiment; In review, Transportation Research C., submitted Mar. 2009, Resubmitted in revised form Jun. 2009, pp. 1-30.

Leung, D.Y.C. et al; Modelling of Motor Vehicle Fuel Consumption and Emissions Using a Power-Based Model; Environmental Monitoring and Assessment 65, 21-29, 2000, Kluwer Academic Publisher, printed in the Netherlands.

Herrera, Juan C., Incorporation of Langrangian Measurements in Freeway Traffic State Estimation; In review, Transportation Researc B (Paper No. TRB-D-08-00150); Submitted Jul. 2008, resubmitted in revised form Feb. 2009, Mar. 2009, May 2009, pp. 1-36.

Ganti, Raghu K. et al; GreenGPS: A Participatory Sensing Fuel-Efficient Maps Application, MobiSys' 10, Jun. 15-18, 2010, San Francisco CA pp. 151-164.

Mohan, Prashanth et al; Nericell: Rich Monitoring of Road and Traffic Conditions Using Mobile Smartphones: SenSys' 2008, Nov. 5-7, 2008, Raleigh, NC, pp. 1-14.

Pham, Nam et al: Fueoogle: A Participatory Sensing Fuel-Efficient Maps Application; https://www.ideals.illinois.edu/bitstream/handle/2142/13916/paper.pdf?sequence=2; 2009.

Jackson, Eric; Improving Traffic Simulation Models and Emissions Models Using On-Board Vehicle Dynamics Data; A Dissertation in Partial Fulfillment of the Requirements for the Degree of Doctor of Philosophy at the University of Connecticut, 2008, Copyright 208 by ProQuest LLC, Ann Arbor, MI.

Huang, Zhen, Dynamic Emission Prediction Platform and Its Integration with Microscopic Traffic Simulation; Uppsala Universitet, Apr. 2009, pp. 1-64.

Tyagi, V. et al; A Review of the Mathematical Models for Traffic Flow; Non-Linear Analysis: theory, Methods & Applications, vol. 69 No. 3, pp. 950-970, Aug. 2008.

* cited by examiner

FIG. 5A
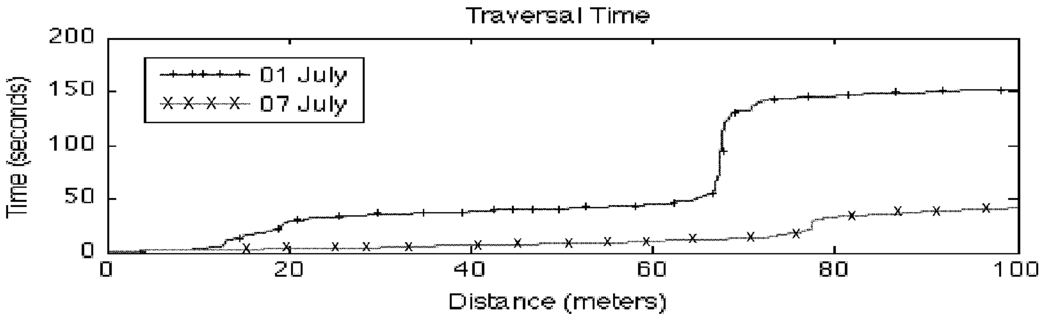
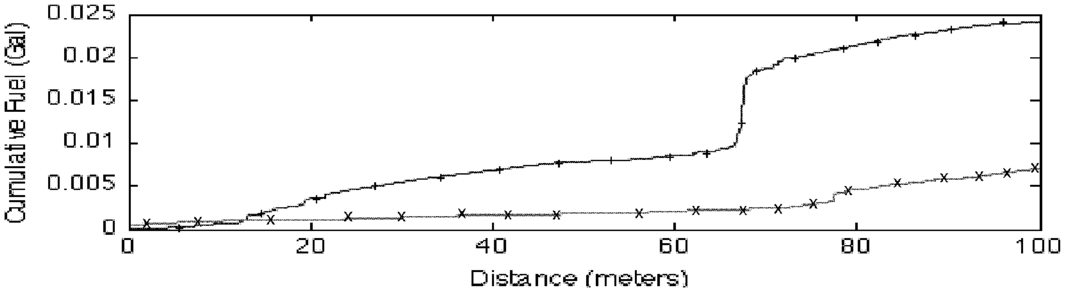
FIG. 5B

SYSTEM AND METHOD FOR PROVIDING ROAD CONDITION AND CONGESTION MONITORING USING SMART MESSAGES

FIELD OF THE INVENTION

The present invention is generally related to traffic and road condition monitoring, and more particularly is related to the use of smart messages for providing road condition and congestion monitoring.

BACKGROUND OF THE INVENTION

Traffic and road-condition monitoring are keys to drive efficiency, pollution reduction, and city planning. Start and stop traffic of a vehicle has a strong impact on fuel consumption. Frequent accelerations and decelerations due to multiple stop-and-go traffic events show significant fuel consumption while making reduced progress along the road. Whether due to traffic signals or congestion the amount of stop-and-go (decelerations and accelerations) can be significant. To improve fuel efficiency, one can either reduce the amount of fuel used during stop-start events (regenerative braking) or reduce the amount of stop-start by choosing routes that encounter fewer deceleration events. Multiple other factors also influence fuel use including, but not limited to, vehicle idling time, road gradient, traffic, road speed, and even the direction of turns.

Traditionally, data regarding traffic and road-conditions has been collected by observation of traffic from helicopters, by cameras monitoring traffic, from human reports, and from limited sensors. Examples of such sensors include, for example, but not limited to, traffic light sensors and other known sensors.

More recently, crowd-sourcing of Global Positioning System (GPS) data has been utilized to generate traffic information automatically and in real time. While this is an advance over the traditional approach, GPS-based approaches have deficiencies. First, GPS is only accurate to approximately five meters. Assisted GPS, or AGPS, which is a system that can improve the startup performance of a GPS satellite-based positioning system, is even less accurate. Second, GPS readings require large amounts of power and can only be collected every few seconds. As a result, the GPS coordinates of vehicles can move a significant amount between "snap shots". Inferring traffic from GPS requires a great deal of data, which must be accumulated from a large crowd, as well as cleansing of the accumulated data. The requirement for great amount of data and cleansing of such data is because, while the GPS data may make it possible to infer coarse macroscopic trends, the GPS data is not as useful in identifying traffic buildups on the local scale.

It should be noted that, even if GPS updated frequently, uploading GPS data has an impact on bandwidth consumption. Blindly uploading GPS data can also have an impact on computation and efficiency at a server used to receive and clean GPS data. For at least these reasons, existing approaches used for monitoring traffic and road-conditions suffer in accuracy, reliability, and timeliness. In addition, existing techniques have focused on traffic but not on other aspects of road condition which are equally important. For example, it may be valuable to estimate emissions on a street, or determine whether there is ice on a street. Further, anticipating factors, such as, but not limited to, fuel consumption, cannot be performed by using distance from a first point to a second point alone. Road conditions, emissions, and other information is important for route planning, safety, city management, dynamic toll pricing, and other things.

Thus, a heretofore unaddressed need exists in the industry to address the aforementioned deficiencies and inadequacies.

SUMMARY OF THE INVENTION

Embodiments of the present invention provide a system and method for providing road conditions and monitoring congestion. Briefly described, in architecture, one embodiment of the system, among others, can be implemented as follows. A communication device for providing road conditions and monitoring congestion, contains a memory and a processor configured by the memory to perform the steps of: extracting key current vehicle and/or traffic insight; determining if the extracted key current vehicle and/or traffic insight represents a departure from expected vehicle and/or traffic insight; if the extracted key current vehicle and/or traffic insight is a departure from expected vehicle and/or traffic insight, using the key current vehicle and/or traffic insight to create a smart message, wherein the smart message contains the extracted key current vehicle and/or traffic insight; and if the extracted key current vehicle and/or traffic insight is a confirmation of expected vehicle and/or traffic insight, creating a confirmation message that does not contain the extracted key current vehicle and/or traffic insight, yet confirms similarity between the extracted key current vehicle and/or traffic insight and the expected vehicle and/or traffic insight.

The present invention can also be viewed as providing a system for providing road conditions and monitoring congestion. The system contains at least one communication device, wherein the communication device contains a memory and a processor configured by the memory to perform the steps of: extracting key current vehicle and/or traffic insight; determining if the extracted key current vehicle and/or traffic insight represents a departure from expected vehicle and/or traffic insight; if the extracted key current vehicle and/or traffic insight is a departure from expected vehicle and/or traffic insight, using the key current vehicle and/or traffic insight to create a smart message, wherein the smart message contains the extracted key current vehicle and/or traffic insight; and if the extracted key current vehicle and/or traffic insight is a confirmation of expected vehicle and/or traffic insight, creating a confirmation message that does not contain the extracted key current vehicle and/or traffic insight, yet confirms similarity between the extracted key current vehicle and/or traffic insight and the expected vehicle and/or traffic insight. The system also contains a server for communicating with the communication device to receive the smart message and/or the confirmation message. The server also aggregates traffic conditions and/or road conditions from multiple communication devices and transmits alerts regarding the aggregated traffic conditions and/or road conditions to at least one of multiple communication devices.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5A and FIG. 5B are graphs illustrating time spent and fuel consumption, respectively, as a vehicle travels along a road.

DETAILED DESCRIPTION

The present system and method increases the accuracy and reliability of road condition information by providing for aggregation of information regarding vehicle behavior in the context of road and traffic conditions by constructing rich data packets and transmitting smart messages, wherein smart messages may either contain the rich data packets or contain only a confirmation of current conditions. In addition, to reduce energy and bandwidth requirements, the system and method determines when is the best time to transmit smart messages so as to reduce message volume, reduce energy consumption, and reduce computational load. Aggregation of this information may be used for many reasons, including, but not limited to, indicating routes that use the least amount of fuel and determining how different vehicle types perform on different roads.

Figure 1:
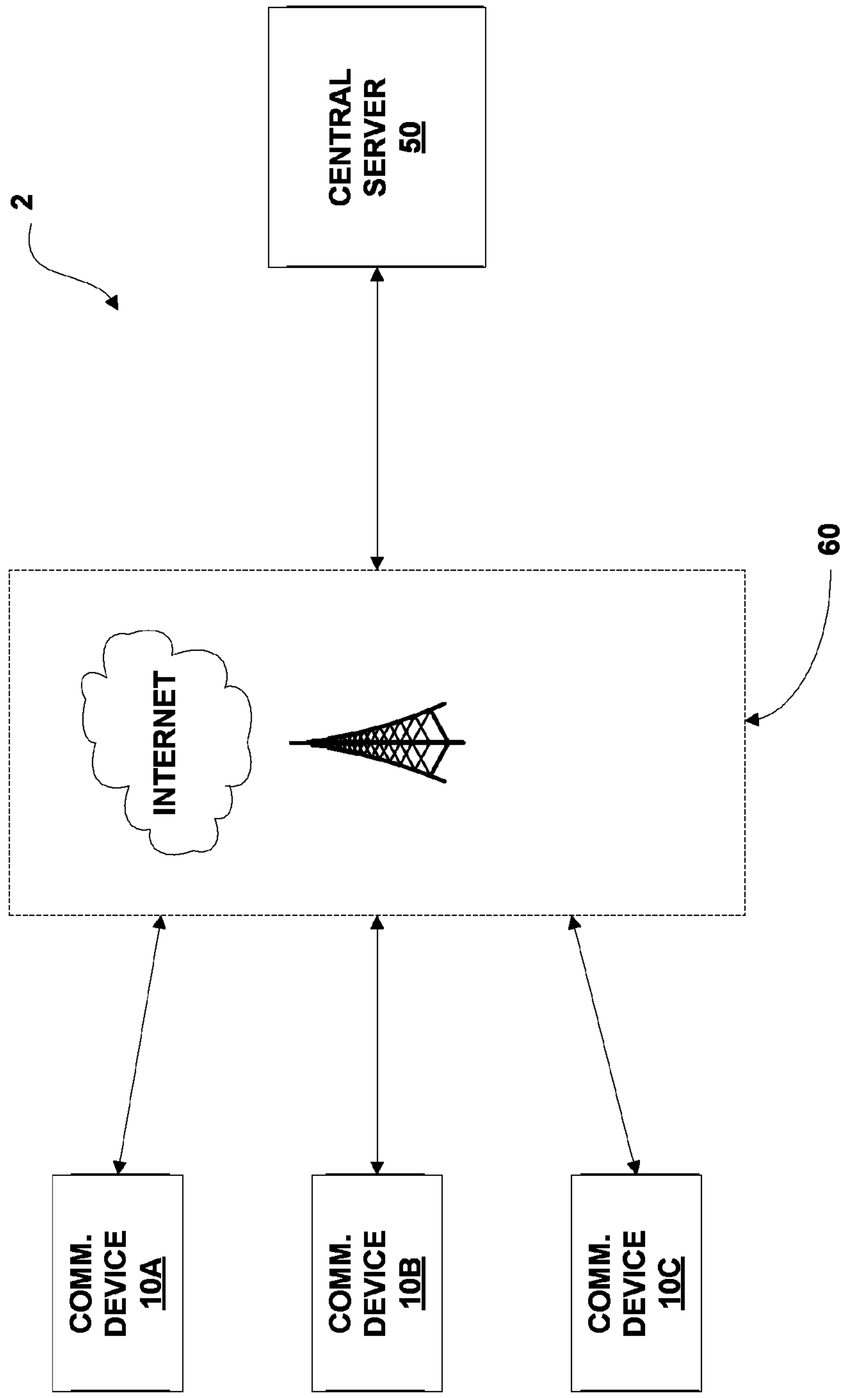
FIG. 1 is a schematic diagram illustrating an exemplary network in accordance with the present system and method.

The present system is provided within a client/server network. FIG. 1 is a schematic diagram illustrating an exemplary network 2 in accordance with the present system and method. As shown by FIG. 1, the network 2 contains multiple communication devices 10A, 10B, 10C. A communication device 10 may be one of many different processing devices such as, but not limited to, a smart phone, or a computer, wherein the computer contains a stand alone circuit board with transmitter and processor, or the computer contains a circuit board with processor and memory, or a different processing device. A detailed description of one example of a communication device 10 is provided with regard to the description of FIG. 2.

Each communication device 10 is associated with a vehicle from which the present system and method seeks to obtain vehicle behavior in the context of road and traffic conditions. Association between a communication device 10 and a vehicle may be provided by the communication device 10 being located within the vehicle, on the vehicle, connected to the vehicle, via, for example, but not limited to, an on board diagnostics (OBD), or OBDII vehicle connection, or other manner of being connected to the vehicle, or provided through any other manner of communication between the vehicle and the communication device. It should be noted that, in accordance with one embodiment of the invention, it is possible to have the communication device 10 physically, but not electronically, attached to the vehicle, where the communication device 10 records information such as, but not limited to, acceleration and/or GPS, without the need for an electrical connection with the vehicle.

Returning to FIG. 1, the exemplary embodiment of the network 2 illustrates that each of the communication devices 10 communicates with a central server 50. The communication devices 10 may communicate with the central server 50 via use of one or more communication protocol provided by a transmission means 60, which is known to one having ordinary skill in the art. As a non-limiting example, the communication device 10 may communicate with the central server 50 via the Internet, through wireless communication, mobile telephone networks, local wireless networks (e.g., WiFi, ZigBee), or through a different communication means. It should be noted that, within the network, communication may be from communication devices 10 to the central server 50, or from the central server 50 to one or more of the communication devices 10.

As is explained in further detail hereinafter, the central server 50 is capable of accumulating smart messages (data) received from multiple communication devices 10 within the network 2, aggregating conditions regarding vehicle behavior in the context of road and traffic conditions, and transmitting alerts to road conditions to communication devices. A detailed description of functionality performed by the central server 50 is provided hereinafter.

Figure 3:
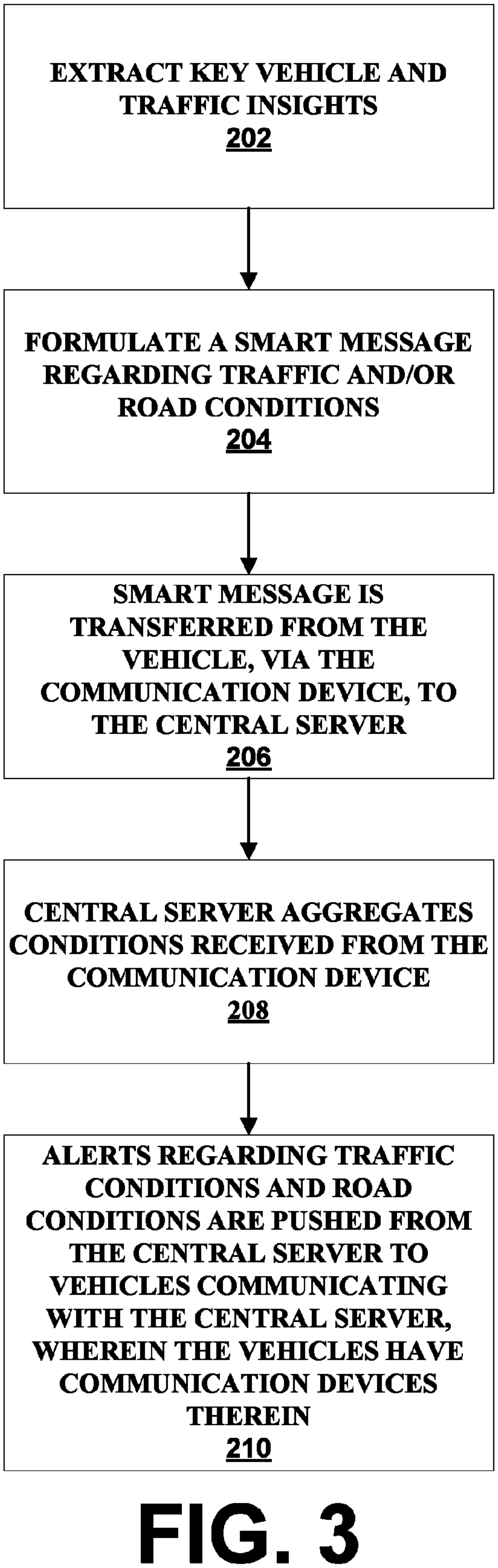
FIG. 3 is flow chart illustrating a general summary of communication and functionality within the network.

FIG. 3 is flow chart illustrating a general summary of communication and functionality within the network. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

As shown by block 202, through use of the present system and method, key vehicle and traffic insights may be extracted at a vehicle. A smart message regarding traffic and/or road conditions may be formulated at the vehicle via the communication device 10 (block 204). As is explained in further detail herein, smart messages may either contain rich data packets or contain only a confirmation of current conditions. As shown by block 206, the smart message is transferred from the vehicle, via the communication device 10, to the central server 50. The central server 50 aggregates conditions received from the communication device 10 (block 208). As shown by block 210, alerts regarding traffic conditions and road conditions may then be pushed from the central server 50 to vehicles communicating with the central server 50, wherein the vehicles have communication devices 10 therein. The alerts may then be viewed by a user of the vehicle.

Functionality of the communication device 10 can be implemented in software, firmware, hardware, or a combination thereof. In a first exemplary embodiment, a portion of the communication device 10 is implemented in software, as an executable program, and is executed by a special or general-purpose digital computer, such as a personal computer, personal data assistant, smart phone, workstation, minicomputer, or mainframe computer. The first exemplary embodiment of a communication device 10 is shown in FIG. 2.

Figure 2:
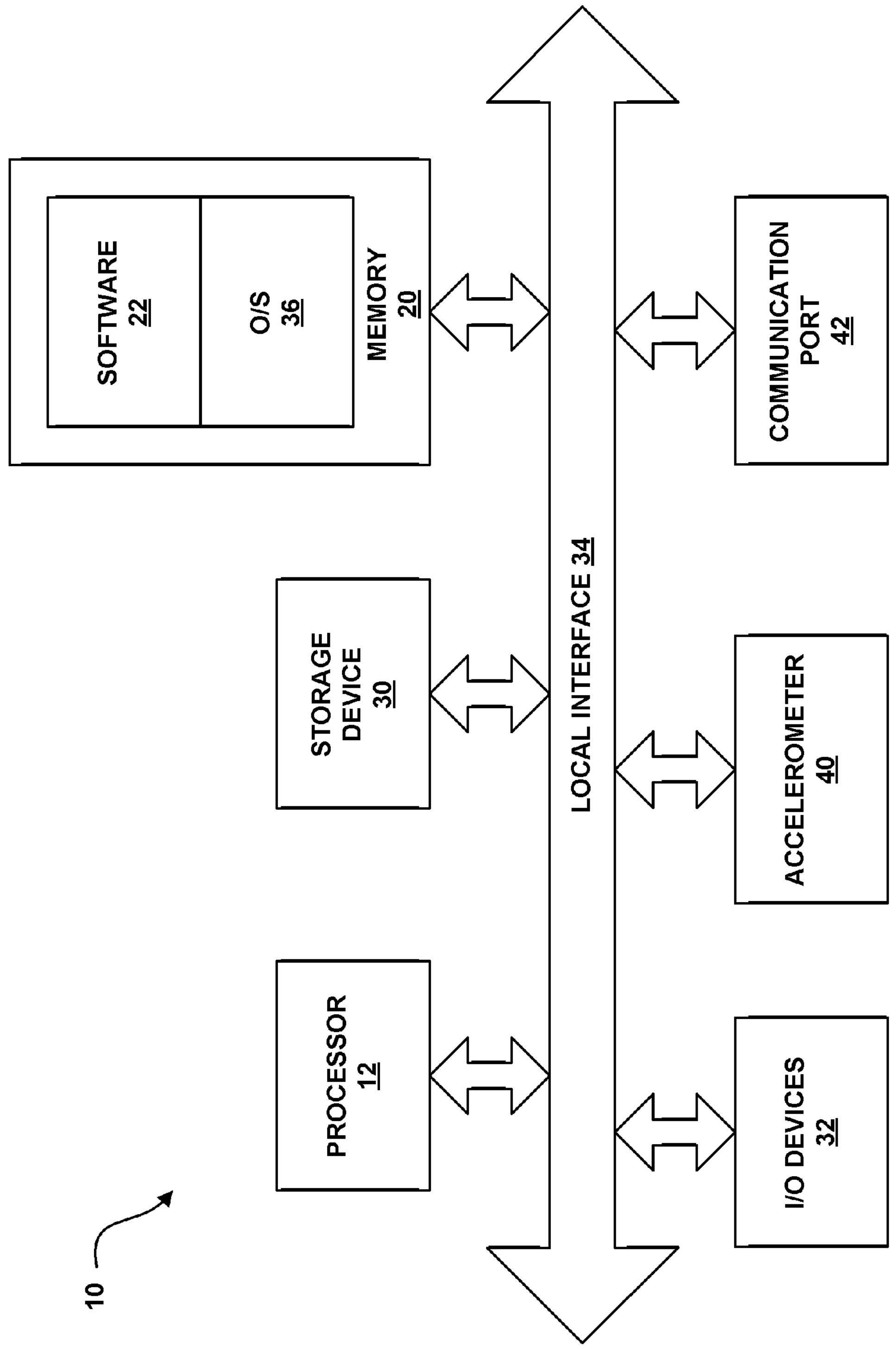
FIG. 2 is a block diagram illustrating one example of a communication device.

Generally, in terms of hardware architecture, as shown in FIG. 2, the communication device 10 includes a processor 12, memory 20, storage device 30, and one or more input and/or output (I/O) devices 32 (or peripherals) that are communicatively coupled via a local interface 34. The local interface 34 can be, for example but not limited to, one or more buses or other wired or wireless connections, as is known in the art. The local interface 34 may have additional elements, which are omitted for simplicity, such as controllers, buffers (caches), drivers, repeaters, and receivers, to enable communications. Further, the local interface 34 may include address, control, and/or data connections to enable appropriate communications among the aforementioned components.

The processor 12 is a hardware device for executing software, particularly that stored in the memory 20. The processor 12 can be any custom made or commercially available processor, a central processing unit (CPU), an auxiliary processor among several processors associated with the communication device 10, a semiconductor based microprocessor (in the form of a microchip or chip set), a macroprocessor, or generally any device for executing software instructions.

The memory 20 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 20 may incorporate electronic, magnetic, optical, and/or other types of storage media. Note that the memory 20 can have a distributed architecture, where various components are situated remote from one another, but can be accessed by the processor 12.

The software 22 in the memory 20 may include one or more separate programs, each of which contains an ordered listing of executable instructions for implementing logical functions of the communication device 10, as described below. In the example of FIG. 2, the software 22 in the memory 20 defines the communication device 10 functionality in accordance with the present invention. In addition, although not required, it is possible for the memory 20 to contain an operating system (O/S) 36. The operating system 36 essentially controls the execution of computer programs and provides scheduling, input-output control, file and data management, memory management, and communication control and related services.

The communication device 10 may be provided by a source program, executable program (object code), script, or any other entity containing a set of instructions to be performed. When a source program, then the program needs to be translated via a compiler, assembler, interpreter, or the like, which may or may not be included within the memory 20, so as to operate properly in connection with the O/S 36. Furthermore, the communication device 10 can be written as (a) an object oriented programming language, which has classes of data and methods, or (b) a procedure programming language, which has routines, subroutines, and/or functions.

The I/O devices 32 may include input devices, for example but not limited to, a touch screen, a keyboard, mouse, scanner, microphone, or other input device. Furthermore, the I/O devices 32 may also include output devices, for example but not limited to, a display, or other output devices. The I/O devices 32 may further include devices that communicate via both inputs and outputs, for instance but not limited to, a modulator/demodulator (modem; for accessing another device, system, or network), a radio frequency (RF), wireless, or other transceiver, a telephonic interface, a bridge, a router, or other devices that function both as an input and an output. I/O devices 32 are used to transmit the smart messages from the vehicle to the central server 50.

When the communication device 10 is in operation, the processor 12 is configured to execute the software 22 stored within the memory 20, to communicate data to and from the memory 20, and to generally control operations of the communications device 10 pursuant to the software 22. The software 22 and the O/S 36, in whole or in part, but typically the latter, are read by the processor 12, perhaps buffered within the processor 12, and then executed.

When the communication device 10 is implemented in software, as is shown in FIG. 2, it should be noted that the communication device 10 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The communication device 10 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The storage device 30 of the communication device 10 may be one of many different types of storage device, including a stationary storage device or portable storage device. As an example, the storage device 30 may be a magnetic tape, disk, flash memory, volatile memory, or a different storage device. In addition, the storage device may be a secure digital memory card or any other removable storage device 30.

In accordance with a first exemplary embodiment of the invention, the communication device 10 may also contain an accelerometer 40 for sensing orientation of the communication device 10. The accelerometer 40 is capable of detecting acceleration and deceleration of a vehicle in which the communication device is positioned. It should be noted that the accelerometer 40 may instead be an inertial measurement unit (IMU) or the equivalent, providing information regarding orientation of the communication device 10.

In accordance with the first exemplary embodiment of the invention, the communication device 10 may also contain a communication port 42. The communication port 42 allows communication between the communication device 10 and one of many different devices. As an example, the communication port 42 is capable of allowing the communication device 10 to communicate with the OBD or OBDII connection port of a vehicle. As a result, the communication port 42 is capable of communication via one or more of many different communication protocols.

It should be noted that in accordance with the above-described embodiment of the invention, a different means of communication is used for communication with the OBD or OBDII than for communication with the central server. While this is the case, one having ordinary skill in the art will appreciate that in accordance with an alternative embodiment of the invention, a similar means of communication may be used for both communication with a vehicle and with the central server.

As is explained in further detail herein, the communication device 10 uses Global Positioning System (GPS) data. As a result, the communication device 10 may either have a GPS device located therein, communicate with the GPS for a vehicle to which the communication device 10 is connected, or communicate with another device that supplies GPS information, via the communication port 42. It should be noted that while the present description provides for use of GPS data, the present invention in not intended to be limited to the use of GPS data. Instead, a different category of positioning data may be used.

Figure 4:
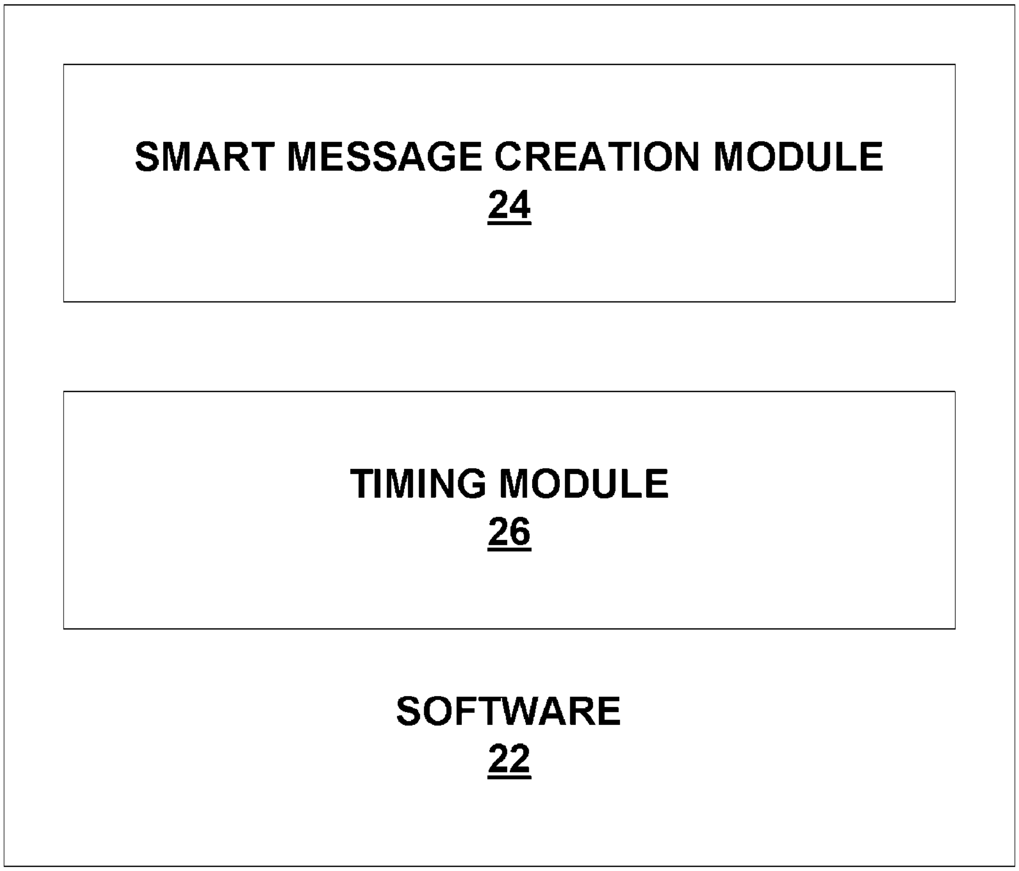
FIG. 4 is a block diagram further illustrating the software of FIG. 2.

FIG. 4 is a block diagram further illustrating the software 22 of the memory 20. As shown by FIG. 4, the software 22 contains a smart message creation module 24 and a timing module 26. Functionality performed by the modules 24, 26 is described in detail herein.

Smart Message Creation Module

The smart message creation module 24 is responsible for creating a smart message to be transmitted from the communication device 10 to the central server 50. Herein, a smart message is defined as a data packet that is created in accordance with the following description. Specifically, instead of transmitting all data from the communication device 10 to the central server 50, in accordance with the present invention, the smart message creation module 24 of the communication device 10 extracts key vehicle and traffic insight[s] and uses such information to create a smart message prior to transmitting the smart message to the central server 50.

Two major features constitute a smart message. The first major feature is a situational assessment of what information is relevant. The second major feature is a derivation of a rich data packet that is high in information with minimal bulk data.

Situational assessment, as performed by the smart message creation module 24, removes the need to transmit unnecessary information. Instead of blindly reporting specific data, such as, but not limited to, GPS data, in a large group of data without discrimination about the value of the GPS data being reported, the smart message creation module 24 uses rules for determining how much data is to be gathered for the smart message that is to be transmitted to the central server 50. Other examples of such data include, for example, velocity profile data (instantaneous velocity as a function of time), instantaneous fuel consumption rate, cumulative fuel consumption, and throttle position.

Vehicle operations that represent departures from expected performance are more important for reporting than data that merely reinforces what is already known. In these cases, data that confirms the current belief of state (e.g., traffic state, road conditions) does not need to be immediately reported, nor does the reporting require much data. In fact, simply noting that the data confirms the current belief of state is sufficient. Instead, data that contradicts the current belief of state needs to be reported in a timelier fashion and with more thorough data, resulting in large smart messages, or large data packets. Recognizing the difference between confirming and contradicting information reduces the amount of data to be transmitted and focuses data and transmission on the most important data.

In accordance with the present invention there are two main modes of the communication device for which current state can be used to modulate the timing of sending the smart message to the central server 50. In a first mode, the vehicle state regarding things such as velocity and traffic characterization can be truncated when repeating information. For example, if the vehicle is experiencing consistent traffic conditions (whether high or low or in-between) the smart message of the communication device 10 merely needs to indicate that the state is consistent with the previously reported data, rather than sending all characterization data again. In this first mode, the communication device 10 of the vehicle stores the previous traffic condition report (or reports) to make this judgment. Such storage may be provided by the storage device 30 of the communication device 10.

In a second mode, the traffic state and/or road condition state of a specific vehicle may warrant truncation when such information is merely confirming information previously reported by other vehicles. Again this information could include traffic condition metrics, road condition data, and/or other information. In this second mode, the specific vehicle receives data from the central server 50 regarding a planned path of the specific vehicle. This received data includes current traffic state and/or road condition state data accumulated by other vehicles, which was transmitted to the central server 50. In cases where the specific vehicle experiences and measures data consistent with what had been previously reported by other vehicles, the specific vehicle only has to send a short confirmation of the consistency in data. If instead the specific vehicle experiences something that contradicts what the central server 50 is reporting as the road condition, the specific vehicle, via the communication device 10, will send more than just a short confirmation, where the more thorough data indicates the contradiction and reports the corrective data. This process provides the transmission of a larger data packet, but with a specific purpose. Road conditions may include things, such as, but not limited to, slippery ice, which is location specific.

It should be noted that, in accordance with an alternative embodiment of the invention, default traffic state/road conditions are provided to the communication device 10. If actual traffic state/road conditions are contrary to the default, the communication device 10 reports to the central server 50 with larger, descriptive, data. Alternatively, if actual traffic state/road conditions are the same, or within a predefined range of the default traffic state/road conditions, short confirming data is communicated to the central server 50, without the need for large, descriptive, data. Without further data, the communication device 10 assumes that the default traffic state/road conditions have not changed. Of course, the central server 50 may also change the default traffic state/road conditions stored at the communication device 10 by transmitting updates. Such changes may be in accordance with updates to traffic state/road conditions as received from other communication devices located within other vehicles. There is no need for the central server 50 to transmit updates to the communication device 10 when traffic state/road conditions have not changed.

It should be noted that a contradiction between traffic state and/or road conditions may be defined as falling outside of an acceptable range of contradiction. Specifically, a contradiction need not only be defined as data that is not exactly the same as previously received data.

The construction or derivation of a rich data packet, also referred to herein as preprocessing, as performed by the smart message creation module 24, reduces the amount of data that is required to be transmitted from the communication device 10 to the central server 50. As a result of the reduction of data transmitted, the amount of bandwidth used by the communication device 10 is decreased. Preprocessing vehicle data to transmit richer information improves communication between the communication devices 10 and the central server 50 by avoiding sending unnecessary raw data and reducing the bulk of data transmitted to the central server 50. It should be noted that, prior to transmitting a smart message to the central server 50, the smart message creation module 24 may determine that the smart message does not require a rich data packet, as an example, when only a confirmation is required to be transmitted from the communication device 10 to the central server 50.

In accordance with the present invention, rich information is defined as distilled (processed) data from the plethora of GPS, velocity, and other vehicle data that succinctly describes metrics relating to traffic state, road conditions, vehicle state, etc., without having to report the entirety of the raw collected data. Different methods of preprocessing may be used by the smart message creation module 24 to create a rich data packet, which may then be transmitted as a smart message.

For clarification purposes, rich data packets, or rich information, is not the same as a smart message. Rich data is a distilled form of the raw data received from the vehicle and/or communication device, and a smart message may or may not contain the rich data in addition to the associated context. In other words, depending on the currently stored traffic state and/or road conditions stored at the central server 50, the smart message may contain things such as, for example, confirmation signals as previously described, which hold little to no rich data. In addition, the amount of rich data sent is not an all or nothing factor. For example, some rich information might conform to the known state and does not need to be transmitted (for example, traffic level), while other information is novel and does need to be transmitted (for example, slippery conditions). To elaborate, the smart message is a message that only contains what is required depending upon the data currently stored at the central server 50, as a result, it is "smart."

A smart message that refutes a previous state would hold more rich data to describe the change in state. The thing that makes rich data 'rich' is the distillation of raw data into a smaller but more descriptive form. Alternatively, the thing that makes smart messages 'smart' is taking current context into account when formulating what information needs to be sent to the central server 50 and what information does not.

The following provides examples of data gathered by the smart message creation module 24 during preprocessing to derive rich data. It should be noted that the following are examples of data gathered and methods that may be used to gather such data. One having ordinary skill in the art would appreciate that other methods may be used for gathering important vehicle and road condition data during preprocessing.

A first category of data that may be gathered during preprocessing is space-time series data. Space-time series data includes position of the communication device 10 as a function of time, velocity as a function of time, and acceleration as a function of time. Space-time series data can be extracted from (a) GPS; (b) by integrating accelerometer information over time; or, (c) in certain vehicles, by accessing odometer information directly. It should be noted that it is also possible to use a combination of accelerometer information over time in combination with odometer information to extract space-time series data. Space-time series data can be used to infer traffic more accurately than by merely using location.

It should be noted that features in the space-time data can also be used to trigger a transmission to the central server 50. As an example, in the graphs of FIG. 5A and FIG. 5B, a slow-down at a distance of about 65 meters in the street segment shown indicates traffic congestion. In accordance with the present invention, under certain circumstances, it is determined that this is the point in time that it is appropriate to upload data from the communication device 10 to the central server 50.

The space time-series data can be used to compute congestion and other parameters, such as, but not limited to, whether the vehicle is stuck at the back of a long queue of vehicles before a traffic light, and whether the vehicle needs to wait several lights before clearing the lights. As an example, when a vehicle encounters several cycles of waiting at a traffic light, the velocity profile shows several periods of no motion with a short distance traveled between these stops. Counting the number of stops in the block preceding the light allows for determining the number of cycles encountered in the queue. GPS location identifies the traffic intersection where the light is encountered.

In addition to trajectory information, time sequence and informational digests also provide important information regarding vehicle travel, which may be incorporated into the smart message during preprocessing. As an example, the number of acceleration and deceleration events over the past few minutes indicates aspects of the traffic encountered. Acceleration and deceleration events can be inferred from the accelerometer on a smart phone, for example. Accelerometer events can also be used to trigger a smart message upload to the central server 50.

As another example, similar to how the traffic light queue is determined with velocity data, acceleration data also shows a traffic light queue as a series of periods of no acceleration (zero acceleration) with short bursts of acceleration/deceleration in between. Distinguishing this from road traffic (stop-and-go traffic) is a matter of comparing the regularity of the stops. Traffic lights have regular cycles, while traffic has less regular cycles.

Key data elements of the rich data packets also include kinematic metrics, which capture evidence of the road and/or traffic conditions. One example of a kinematic metric is the time integral of the absolute value of acceleration, which demonstrates a strong correlation to fuel consumption. This kinematic metric provides an alternative to obtaining fuel consumption data from the OBDII connection. Thus, in accordance with an alternative embodiment of the invention, the present system could obtain fuel consumption data without need for OBDII, for example, by use of a mobile phone equipped with an internal accelerometer chip. Other kinematic metrics involving velocity, velocity squared, or velocity cubed can also be reported to augment the information conveyed about road and traffic conditions.

Direct measurement of vehicle data, such as, fuel consumption, also provides key insights into vehicle state and traffic characterization. FIG. 5A and FIG. 5B illustrate time spent and fuel consumption, respectively, as a vehicle travels along a road. Even on the same road segment, vastly different fuel use may be encountered. Fuel consumption can be accessed by either measuring mass air-flow over OBDII, or, in certain vehicles, by reading the fuel gauge over OBDII. Fuel consumption is beneficial to analyze for determining traffic congestion.

In accordance with the present invention, fuel consumption is normalized to remove the effects of the vehicle itself (larger vehicles consume more fuel), slope (up-slopes consume more fuel), and even wind velocity. As a result, it is normalized fuel consumption that is a real proxy. Normalization can be achieved by either comparing the behavior of the vehicle on a route against its own behavior during previous trips, or by using map and vehicle models to extract information that is only related to current road and traffic conditions. As demonstrated herein, in certain embodiments two-way communication is provided between the vehicle and the central server 50. In one embodiment, the central server 50 can transmit relevant route information to the vehicle, while in another embodiment, the vehicle can store selected routes, or possibly all routes.

Fuel consumption can be modeled as an integral of space-time series data. Additional information and insights can be developed via formulae based on the raw data (trajectory, time sequences, and digests). As an example, if fuel consumption could not be directly measured, velocity and acceleration data combined with rolling resistance, drag, and engine models relate the base data to fuel consumption, as shown by equation 1 below. This information can be accessed from accelerometers on smart phones. Similarly, other formulae can quantify and isolate other vehicle and traffic characteristics, especially those that cannot be measured directly, such as, but not limited to, gearing and braking.

$$F = \int_{t-\Delta}^{t} (a(\dot{x}(t))^2 + b\dot{x}(t) + c\ddot{x}(t))\,dt \qquad \text{(Eq. 1)}$$

Equation 1 is an example of how fuel consumption relates to other measurable quantities. This is an example of how a quantity of interest can be derived via models. Equation 1 calculates fuel consumption as a function of velocity and acceleration. Alternatively, fuel consumption can also be indirectly measured via OBDII measurement of mass air flow. Either way, these models allow for learning more about what is happening with the vehicle. Other equations (and other models) will describe other vehicle and traffic characteristic that are not directly measured. For example, gearing, braking, etc. In relation to pre-processing, these models operate to determine the overall condition and state of the vehicle. In some cases, the calculated quantity from a model might be the rich data reported to the central server.

These metrics can also be used to trigger the transmission of smart messages to the central server 50. As an example, an equation may be used that determines the likelihood of ice on the road. If a calculated probability exceeds some threshold, this might result in the triggering of the transmission of a smart message to report the danger right away.

Timing Module

As previously, mentioned, features in the space-time series data can also be used to trigger a transmission, as is used by the timing module 26. As an example, in the graphs of FIG. 5A and FIG. 5B, a slow-down at a distance of about 65 meters in the street segment shown indicates traffic congestion. In accordance with the present invention, this is the point in time used by the timing module 26 to upload data from the communication device 10 to the central server 50. An example of a particular upload rule might be: (when velocity$<$threshold) and (location$\neq$traffic light) then upload data to the central server 50.

Specifically, changes in conditions between what is stored at the central server 50 and what is detected at the vehicle, and/or the occurrence of an important event, trigger a transmission of a smart message from the communication device 10 to the central server 50. As previously mentioned, vehicle operations that represent departures from expected performance are more important for reporting than data that merely reinforces what is already known. Data that confirms the current belief of state does not need to be immediately reported.

Individual vehicles, via the communication devices 10 can report rich information about their path and traffic situations, which can then be aggregated at the central server 50 to form a larger view of a traffic network. The central server 50 receives time-stamped smart messages (packets) containing information about the vehicle (position, velocity, acceleration, etc.) and/or communication device 10. The GPS data may also arrive in independent but time-stamped packets instead of with the smart message. As previously mentioned, the present description refers to this information collected from vehicles as ‘space time-series’. The space time-series information can be processed on the central server side to infer a variety of traffic and/or road conditions, for example, to estimate accurate travel times, to obtain real-time information on traffic congestion, to identify traffic hotspots, or to determine other traffic and/or road conditions.

One having ordinary skill in the art will appreciate that individual vehicle data, as well as aggregated data from multiple vehicles, can be mapped with Geospatial Information Systems (GIS) to illustrate, consolidate, and analyze the information from vehicle smart message data packets. Identification of the location of participating vehicles allows for greater optimization of data collection. For example, in an area that has a high density of vehicles, the central server 50 can isolate data collection to a subset of vehicles having the communication device 10 to reduce data transmission costs. Similarly, if data aggregation is lacking information about a particular area, vehicles passing through that area might be asked to send more data, more frequently, specifically, requesting additional data from the communication devices 10. In other words, aggregation not only combines the information collected, but also provides the feedback necessary to strengthen the aggregate picture.

Once an aggregate picture has been calculated from multiple communication devices 10, the aggregate picture itself (localized for participating vehicles) provides useful information back to the vehicles. The aggregate picture provides information of interest to the driver of a vehicle. For example, traffic information along the projected route could influence the decision of the driver on route. The aggregate picture also provides guidelines for the data collection system itself. As previously mentioned, repetitive information does not improve the aggregate picture and only serves to waste communication bandwidth and processing power. Corroborative information (data that confirms the current aggregate picture) does not need to be sent to the central server 50 in bulk, and in accordance with the present invention, is not sent to the central server 50. Simply noting that the vehicle confirms the current state is sufficient and more streamline. On the other hand, as previously mentioned, contradictory information (data that conflicts with the current aggregate picture) is more vital and is transmitted to the central server 50.

Several examples are presented below to illustrate how vehicle data can be used to extract various traffic features. For the sake of simplicity, the analysis is presented for a road segment between traffic lights A and B. The space time-series data from a car that passes from traffic light A to traffic light B is collected. Let $t_A$ and $t_B$ denote the time instances at which the vehicle passes through traffic lights A and B respectively. The following focuses on the time-series of the vehicle between $t_A$ and $t_B$. FIG. 6, containing FIG. 6A, FIG. 6B, FIG. 6C, and FIG. 6D, provides a series of graphs showing the distance-versus-time, speed-versus-time, speed-versus-distance, and acceleration-versus-time profiles of the vehicle between these two instances. The above four data series are denoted as $(t,d_t)$, $(t,v_t)$, $(d_t,v_t)$ and $(t,\alpha_t)$ respectively. A variety of filtering techniques can be applied to extract features, examples of which follow.

Let $d_{AB}$ denote the distance between traffic lights A and B. The average speed of the vehicle along the segment AB can be calculated simply as $d_{AB}/(t_B-t_A)$. However, the detailed space time-series allows for extraction of several more features.

$(t,v_t)$ can be used to calculate the moving averages of the speed for time windows of various size. The speed profile could potentially include two kinds of fluctuations. The first kind includes the relatively large changes as the driver responds to the traffic. The second kind includes minor fluctuations and may arise due to noise or local disturbances. Depending on the size of the time windows, moving averages may help to suppress the fluctuations of the second kind and provide a better picture regarding the actual response of the driver. The optimal size of the window needs to be carefully chosen as the smaller size may still retain minor fluctuations and the larger size may excessively smooth the data and suppress important features.

$(t,v_t)$ can also be used to compute the autocorrelation of the speed with respect to time. The autocorrelation is computed by convolving the signal with itself for different values of the signal shift. In addition, $(t,v_t)$ can be partitioned into a subset of time series for multiple time windows and the autocorrelation is computed for each sub-time-series. The autocorrelation is primarily used in signal processing to identify randomness in the signal. For instance, if the convolution of $v_t$ and $v_{t+k}$ is zero (k being the shift), it means that the two signals are uncorrelated. The signal autocorrelation can be used to construct the dynamics of the vehicle using system identification approaches. This model can be used to adaptively sample the data and reduce the sampling rate. In turn, the data itself can be used to further modify the model parameters.

Figure 6A:
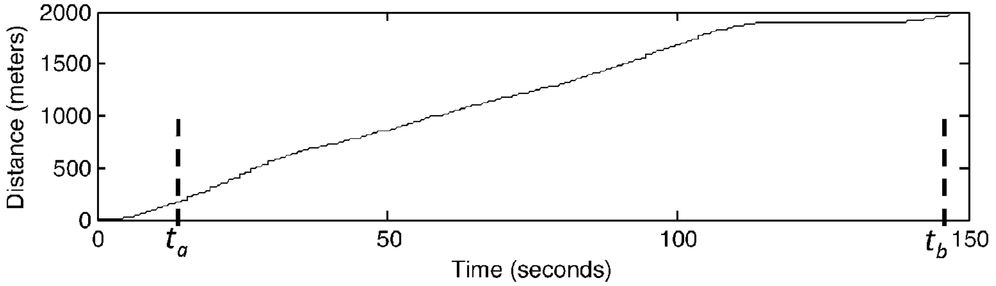
FIG. 6A, FIG. 6B, FIG. 6C, and FIG. 6D, provide a series of graphs showing the distance-versus-time, speed-versus-time, speed-versus-distance, and acceleration-versus-time profiles, respectively, of a vehicle between two instances.
Figure 6B:
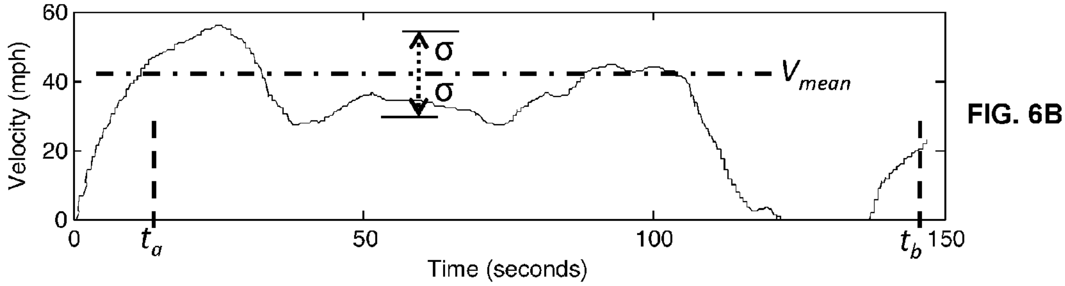
Figure 6C:
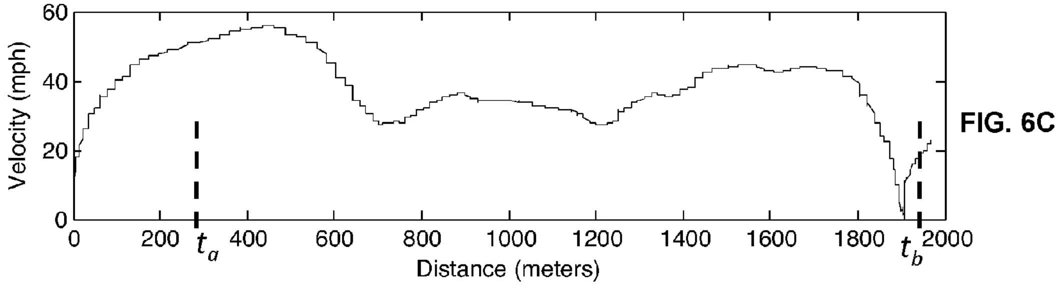
Figure 6D:
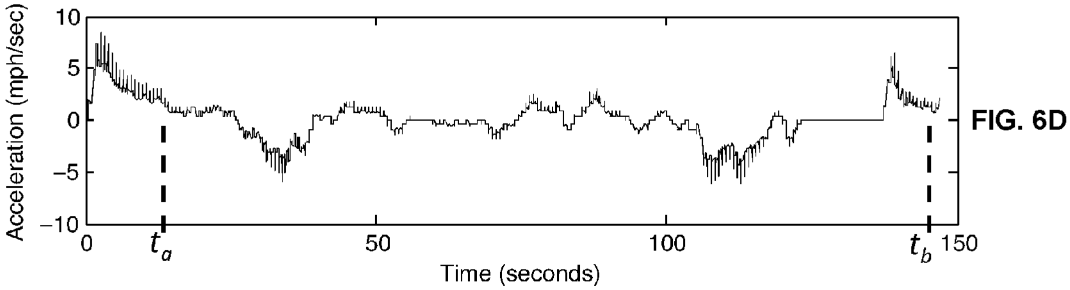

For different time windows, the variance of the speed (or the moving averages of the speed) is computed, as is shown in FIG. 6B by σ. Response of a driver to the current traffic conditions is reflected in the average speed as well as the speed fluctuations above the mean speed. The variance σ captures the latter effect. In an external setting, the correlations between the average speed and the variance, and the number of vehicles on the road segment for various conditions can be calculated. A formula can be derived to relate the number of vehicles to the average speed and σ. In this specific example, the variance of the speed for the time interval between $t_A$ and the first time the vehicle comes to halt can help identify the number of vehicles on the road segment.

Using the position and velocity time series, the speed-versus-position series $(d_t,v_t)$ of the vehicle can be computed. For this series as well, the moving averages of the speed with respect to the position for different distance windows can be calculated. This reveals how the speed varies with the location. The data series can be partitioned for different values of distance windows and the speed average over each window can be computed. This is equivalent to looking at the discrete samples of the moving averages. The variation of the average speed values for different partitions can help identify the bottleneck locations. This particularly is important when data for several vehicles exists.

It is noted that in FIG. 6B the vehicle comes to a full stop as it approaches the traffic signal B. Using the position information, the distance at which the vehicle comes to halt can be computed. This information is used to calculate how many vehicles are, waiting at the traffic light ahead of the vehicle currently being followed. Assuming values for the average vehicle-length and the average distance between two vehicles, the number of vehicles waiting ahead at traffic light B can approximately be computed.

Kinematic metrics, such as the time integral of the absolute value of acceleration, offer insights into vehicle performance along a route. While the time integral of acceleration is equal to the velocity, the time integral of the absolute value of acceleration quantifies both accelerations and decelerations (start-stop events), which better models fuel use. Other kinematic metrics that involve, v (velocity), $v^2$, and/or $v^3$ can also be included to characterize the route. The time integral of v captures the distance traveled. The time integral of $v^2$ captures the rolling resistance of the road, and the time integral of $v^3$ captures the drag on the vehicle.

Another parameter that can be calculated using the speed profile is the number of traffic signals the vehicle has to wait before it crosses the traffic light. From FIG. 6B, it can be seen that the vehicle waits at the traffic light for certain duration and then starts moving and clears the traffic light. In certain situations, a vehicle may have to wait for a number of signals before it clears the traffic signal. This information is captured by counting the number of times the vehicle comes to a full stop. Typically, as the light turns green, vehicles move before the light turns red again. In addition, the actual time it takes for the vehicle to cross the traffic light can also be computed.

It should be noted that the abovementioned examples illustrate several, but not all, metrics that can be used to characterize the vehicle, road, and traffic conditions. One having ordinary skill in the art would appreciate that other metrics may be determined.

Using methods previously described, vehicles can obtain rich data/information about traffic and send smart messages to the central server 50. Aggregated data from multiple vehicles can be processed at the central server 50 to obtain an aggregate traffic picture. The following provides a number of examples of how various aggregate features, as derived from data received from multiple vehicles, can be extracted.

Given that data from vehicles comes at different times during the day, the parameters discussed earlier such as, but not limited to, the moving averages, variances, and traffic back-ups, can be computed as a function of time during the day. This information can be mapped to the GIS. This can help drivers to identify which relevant roads have traffic congestion and at what times. Drivers can then make decisions regarding which roads are to be avoided and at what times while commuting.

If a road is divided into multiple suitable sections, using the distance versus speed data-series from multiple vehicles, average speeds of vehicles in various sections of the road can be obtained. These values can be correlated to identify bottleneck sections in the road, where the average speed is reduced regardless of the time of the day. This information can be used to verify if there is a presence of a traffic blocking hazard such as a pothole or narrowing of a lane. Such information is useful to identify steps to improve traffic conditions.

If data is received from two or more vehicles for a road segment around the same time of the day, the values of the average speed, the number of vehicles, as well as other data, can be compared and confidence levels can be obtained. Confidence level is a metric indicating how reliable the system believes the reported data is. If multiple vehicles report data that directly contradict each other (same time and place), then the overall confidence in the aggregated report goes down. Alternatively, if multiple vehicles report data that corroborate each other, then the confidence goes up. This process can be used to determine whether new data is adding any new information. Based on the determination as to whether new data is adding any new information, the upload rate for smart messages, from vehicles, via the communication device 10, to the central server 50, or vice versa, can be optimized.

A network-based model for traffic can be constructed by using data received from multiple vehicles. This model can be used to tune the data collection over the network. In turn, the data itself can be used to adaptively modify the model of the traffic. An exemplary approach to construct such a model is now described.

The road network can be partitioned into a network of non-uniform road segments. A road segment may consist of a part of a road between two traffic lights or intersections, a sharp bend, or simply a part of a road. Such a network can be represented in terms of a graph where each edge represents a road segment and nodes represent intersections. For each road segment, the mean of the average speed, as well as the variance of the average speed for different times during the day, is calculated. Similarly, the covariance between the speeds on two adjacent road segments in the network is calculated as a function of time during the day. This information can be used to construct a graphical model where each edge has associated mean and variance, and the adjacent edges have pair-wise covariance as a function of time.

As a starting point, this information can be used to construct the Gaussian Process (GP) model of this traffic network, which is a kind of probabilistic model. This model can be used to optimize when and where to gather the information as well as make further inferences about the traffic conditions. For instance, if at any given time the average speeds at various road segments is known, the GP model can be used to make inference about the average speeds in other road segments. In particular, the average speeds can be predicted along with the confidence levels. The underlying GP model also provides the advantage of optimizing the information gathering process.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A communication device for providing road conditions and monitoring congestion, comprising:

a memory; and a processor configured by the memory to perform the steps of:

extracting at least one current vehicle and/or traffic condition at a vehicle having the communication device;

determining if the extracted current vehicle and/or traffic condition represents a departure from an expected vehicle and/or traffic condition;

if the extracted current vehicle and/or traffic condition is a departure from the expected vehicle and/or traffic condition, using the current vehicle and/or traffic condition to create a smart message, wherein the smart message contains extracted current vehicle and/or traffic condition data; and if the extracted current vehicle and/or traffic condition is a confirmation of the expected vehicle and/or traffic condition, creating a confirmation message that does not contain the extracted current vehicle and/or traffic condition data, yet confirms similarity between the extracted current vehicle and/or traffic condition and the expected vehicle and/or traffic condition, wherein an expected vehicle and/or traffic condition is a previously stored vehicle and/or traffic condition, wherein the expected vehicle and/or traffic condition comprises a prior extracted vehicle and/or traffic condition from one or more other vehicles that were driving on a path that is the same as a path currently being driven by the current vehicle, and wherein the extracted current vehicle and/or traffic condition is a departure from the expected vehicle and/or traffic condition if the extracted current vehicle and/or traffic condition is outside of a predefined range of values relative to the expected vehicle and/or traffic condition.

2. The communication device of claim 1, wherein the communication device is physically connected to the current vehicle, but not electronically connected to the current vehicle.

3. The communication device of claim 1, wherein the communication device is in communication with the current vehicle through use of an on board diagnostics (OBD) or OBDII vehicle connection.

4. The communication device of claim 1, wherein the expected vehicle and/or traffic condition comprises a previously extracted current vehicle and/or traffic condition from the current vehicle.

5. The communication device of claim 1, wherein confirmation of the expected vehicle and/or traffic condition occurs when the extracted current vehicle and/or traffic condition is within a predefined range of values from the expected vehicle and/or traffic insight.

6. The communication device of claim 1, wherein the communication device transmits the smart message when the extracted current vehicle and/or traffic condition is a departure from the expected vehicle and/or traffic condition.

7. A system for providing road conditions and monitoring congestion, comprising:

at least one communication device, wherein the communication device further comprises:

a memory; and a processor configured by the memory to perform the steps of:

extracting at least one current vehicle and/or traffic condition;

determining if the extracted current vehicle and/or traffic condition represents a departure from expected vehicle and/or traffic condition;

if the extracted current vehicle and/or traffic condition is a departure from an expected vehicle and/or traffic condition, using the current vehicle and/or traffic condition to create a smart message, wherein the smart message contains extracted current vehicle and/or traffic condition data; and if the extracted current vehicle and/or traffic condition is a confirmation of expected vehicle and/or traffic condition, creating a confirmation message that does not contain the extracted current vehicle and/or traffic condition data, yet confirms similarity between the extracted current vehicle and/or traffic condition and the expected vehicle and/or traffic condition; and a server for communicating with the communication device to receive the smart message and/or the confirmation message, wherein an expected vehicle and/or traffic condition is a previously stored vehicle and/or traffic condition, wherein the expected vehicle and/or traffic condition comprises a prior extracted vehicle and/or traffic condition from one or more other vehicles that were driving on a path that is the same as a path currently being driven by the current vehicle, and wherein the extracted current vehicle and/or traffic condition is a departure from the expected vehicle and/or traffic condition if the extracted current vehicle and/or traffic condition is outside of a predefined range of values relative to the expected vehicle and/or traffic condition.

8. The system of claim 7, wherein the server aggregates traffic conditions and/or road conditions from multiple communication devices, including the at least one communication device.

9. The system of claim 8, wherein the server transmits alerts regarding the aggregated traffic conditions and/or road conditions to at least one of the multiple communication devices.

10. The system of claim 7, wherein the communication device is physically connected to a vehicle, but not electronically connected to the vehicle.

11. The system of claim 7, wherein the communication device is in communication with a vehicle through use of an on board diagnostics (OBD) or OBDII vehicle connection.

12. The system of claim 7, wherein the expected vehicle and/or traffic condition comprises a previously extracted current vehicle and/or traffic condition from the current vehicle.

13. The system of claim 7, wherein confirmation of the expected vehicle and/or traffic condition occurs when the extracted current vehicle and/or traffic condition is within a predefined range of values from the expected vehicle and/or traffic condition.

14. The system of claim 7, wherein the communication device transmits the smart message when extracted current vehicle and/or traffic condition is a departure from the expected vehicle and/or traffic condition.

* * * * *